(12) United States Patent
Foong et al.

(10) Patent No.: US 9,401,345 B2
(45) Date of Patent: Jul. 26, 2016

(54) SEMICONDUCTOR DEVICE PACKAGE WITH ORGANIC INTERPOSER

(71) Applicants: Chee Seng Foong, Sg. Buloh (MY); Navas Khan Oratti Kalandar, Austin, TX (US); Lan Chu Tan, Singapore (SG)

(72) Inventors: Chee Seng Foong, Sg. Buloh (MY); Navas Khan Oratti Kalandar, Austin, TX (US); Lan Chu Tan, Singapore (SG)

(73) Assignee: FREESCALE SEMICONDUCTOR, INC., Austin, TX (US)

(*) Notice: Subject to any disclaimer, the term of this patent is extended or adjusted under 35 U.S.C. 154(b) by 39 days.

(21) Appl. No.: 14/474,294

(22) Filed: Sep. 1, 2014

(65) Prior Publication Data
US 2016/0064356 A1    Mar. 3, 2016

(51) Int. Cl.
| | |
|---|---|
| *H05K 7/10* | (2006.01) |
| *H01L 25/065* | (2006.01) |
| *H01L 23/00* | (2006.01) |
| *H01L 21/48* | (2006.01) |
| *H01L 21/768* | (2006.01) |
| *H01L 23/498* | (2006.01) |

(52) U.S. Cl.
CPC .......... *H01L 25/0657* (2013.01); *H01L 21/486* (2013.01); *H01L 21/4853* (2013.01); *H01L 21/76877* (2013.01); *H01L 23/49816* (2013.01); *H01L 23/49827* (2013.01); *H01L 23/49838* (2013.01); *H01L 24/81* (2013.01); *H01L 2224/03602* (2013.01); *H01L 2224/81005* (2013.01); *H01L 2224/8185* (2013.01)

(58) Field of Classification Search
CPC ................. H01L 2924/01327; H01L 2924/00; H01L 2224/48227; H01L 27/14618; H01L 2924/01067; H01L 2924/01079; H01L 2924/3025
See application file for complete search history.

(56) References Cited

U.S. PATENT DOCUMENTS

| | | | |
|---|---|---|---|
| 8,263,439 B2 | 9/2012 | Marimuthu et al. | |
| 8,411,459 B2 | 4/2013 | Yu et al. | |
| 8,581,402 B2 | 11/2013 | Yu et al. | |
| 2005/0029634 A1* | 2/2005 | Ambrus | H01L 23/3107 257/666 |
| 2012/0074585 A1 | 3/2012 | Koo et al. | |
| 2012/0214302 A1* | 8/2012 | Jeong | H01L 21/76898 438/613 |
| 2013/0029031 A1 | 1/2013 | Jeon et al. | |
| 2013/0242493 A1 | 9/2013 | Shenoy et al. | |
| 2014/0183731 A1* | 7/2014 | Lin | H01L 23/49816 257/738 |

* cited by examiner

*Primary Examiner* — Robert Bachner
(74) *Attorney, Agent, or Firm* — Charles E. Bergere

(57) ABSTRACT

A method of making an integrated circuit package, such as a ball grid array, includes providing a flexible tape that has first and second sets of bond pads on respective first and second surfaces thereof. A carrier is attached to the first surface of the flexible tape. Then conductive pillars are formed on the second set of bond pads and an intermediate layer of polymeric compound is deposited on the second surface of the flexible tape. After the compound has cured, a surface of the intermediate layer is ground to expose ends of the conductive pillars to form a sub-assembly comprising the flexible tape and the intermediate layer. Then the carrier is removed from the sub-assembly, thereby creating an interposer. The interposer is attached to a substrate and at least one die is attached to the interposer.

14 Claims, 5 Drawing Sheets

SEMICONDUCTOR DEVICE PACKAGE WITH ORGANIC INTERPOSER

BACKGROUND OF THE INVENTION

The present invention relates generally to semiconductor integrated circuit packaging and, more particularly to semiconductor device packages that incorporate an interposer.

Certain semiconductor packages, such as Ball Grid Array (BGA) packages, include one or more integrated circuit (IC or "chip") dies or other active components electrically coupled to solder balls by way of a substrate. The substrate includes one or more interconnected, patterned metal layers sandwiched between insulating layers. The metal layers electrically connect contact pads on the die to respective solder balls on the exterior of the package. The die is encapsulated by a polymer molding compound to protect the die and one side of the substrate from environmental contaminants. The solder balls on the exterior of the encapsulated die/substrate serve as input and output (I/O) connections to the die and are typically arranged in rows and columns on the bottom of the BGA package for mounting the BGA package on a printed circuit board (PCB).

Compared to other types of semiconductor packages, BGA packages can advantageously provide a larger number of electrical connections than other types of packages, such as quad flat no lead (QFN) packages, and are therefore widely used for dies requiring many I/O connections, such as high-performance microprocessors, large field-programmable gate arrays, or the like.

Due to manufacturing limitations on the minimum size of features on a substrate, the contact pads on the die are usually much closer together (i.e., are more closely pitched) than corresponding conductors can be placed on a typical substrate. To address this issue, an interposer is placed between the die and the substrate to laterally route signals from the closely pitched die pads to the more widely pitched substrate contact pads.

The interposer, typically made of silicon or glass, has, on a first or obverse side, a set of contact pads that are aligned to respective die bond pads. On a second or reverse side of the interposer is a set of bond pads that are aligned with respective bond pads on the substrate. Conductive traces, usually on the first side of the interposer, and metal through-hole vias in the interposer provide signal paths from the first-side bond pads to the second-side bond pads. The conductive traces route signals between the vias and the respective bond pads on the die. Exposed ends of the vias are typically used as the bond pads on the second side of the interposer.

A first set of solder balls or the like connect the die bond pads to the bond pads on the first side of the interposer, and similarly a second set of solder balls or the like connect the bond pads on the second side of the interposer to the bond pads on the substrate. The interposer, along with the die and the above-mentioned bond pads on the substrate, is encapsulated by the mold compound.

The typical BGA package described above can be expensive to make. For example, the materials and processes used to make the silicon or glass interposer might make up a significant portion of the overall cost of the BGA package. More specifically, the interposer material itself is relatively expensive, and the process used to make the metal vias in the interposer, such as by plating, is expensive and time-consuming.

Further, because (i) silicon or glass has a substantially different coefficient of thermal expansion (CTE) than the substrate material (typically a multilayered dielectric formed from layers of woven glass embedded in an epoxy, e.g., FR-4) and (ii) the lateral dimensions of the interposer are approximately the same as that of the substrate, reliability of the BGA package might be degraded because the solder ball connections between the interposer and the substrate might crack as the temperature of the package cycles.

Accordingly, it would be advantageous to have a BGA package with improved reliability that can be less expensive to manufacture than conventional BGA packages.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not been drawn to scale. For example, the thicknesses of layers and regions may be exaggerated for clarity.

DETAILED DESCRIPTION OF THE INVENTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a", "an", and "the", are intended to include the plural forms as well, unless the context clearly indicates otherwise. It further will be understood that the terms "comprises", "comprising", "has", "having", "includes", or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved. Further, the term "or" is to be interpreted as inclusive unless stated otherwise.

One embodiment of the invention is a method for manufacturing a semiconductor device package, such as a ball grid array package.

In one embodiment of the invention, a flexible tape is provided that has first and second sets of bond pads on respective first and second surfaces thereof and the first surface of the flexible tape is attached to a carrier. Then conductive pillars are formed on the second set of bond pads and an intermediate layer of polymeric compound is deposited on the second surface of the flexible tape. A surface of the intermediate layer is ground to expose ends of the conductive pillars to form a sub-assembly comprising the flexible tape and the intermediate layer. Then the carrier is removed from the sub-assembly, thereby creating an interposer. The interposer is attached to a substrate and at least one die is attached to the interposer.

Figure 1:
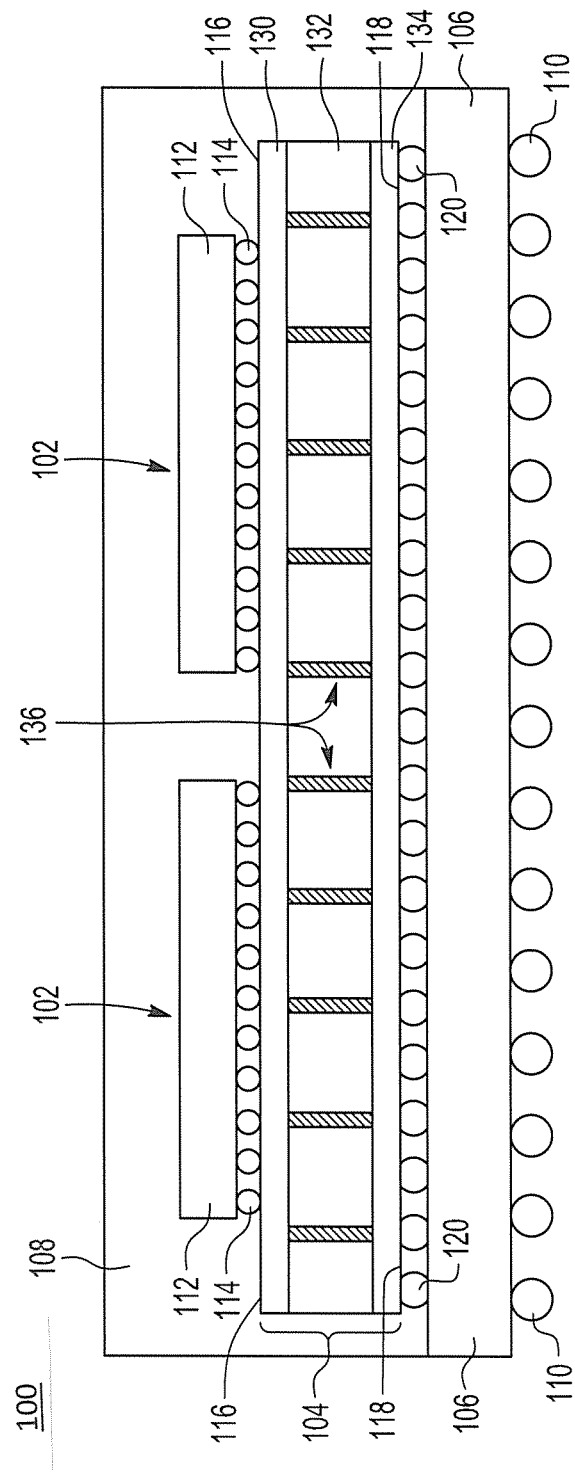
FIG. 1 shows a cross-sectional side view of a ball grid array (BGA) package consistent with one embodiment of the invention.

FIG. 1 shows a simplified cross-sectional side view of a ball grid array (BGA) type semiconductor package 100 consistent with one embodiment of the invention. It is noted that alternative embodiments are not limited to BGA packages, but can be implemented for other package types, such as (without limitation), quad flat no lead (QFN) packages, packages, molded array packages (MAP), and quad flat pack (QFP) or other leaded packages where routing of signals from a semiconductor die to external connections of the package are needed.

The package 100 comprises one or more conventional semiconductor devices or dies 102, an interposer 104, a substrate 106, an overmold 108, and solder balls 110. The solder balls 110 are formed on an exterior surface of the package 100 corresponding to the bottom side of the substrate 106. The dies 102 have multiple die pads (not shown) on a front side 112 of the dies 102. The die pads are used to conduct signals to and from components, such as transistors (not shown), within the dies 102. Such signals include, but are not limited to, digital signals, analog signals, and power supply signals needed for the components in the dies to operate.

Disposed on the die pads are metal balls 114 which attach the dies 102 to bond pads (not shown) on a first surface 116 of the interposer 104. A second surface 118 of the interposer 104 has metal balls 120 thereon that attach bond pads (not shown) on the second surface of the interposer to bond pads (not shown) on the top side of the substrate 106. As will be discussed in more detail below, the interposer provides routing of signals between the closely spaced (narrow-pitch) metal balls 114 and the widely spaced (wide-pitch) metal balls 120. Similarly, the substrate 106 provides routing of signals between the metal balls 120 and the metal balls 110.

The substrate 106 is conventional and typically comprises one or more layers of relatively rigid insulating material, such as FR-4 type woven glass and epoxy, with layers of conductors (not shown) on a front and back surfaces thereof and possibly within the substrate. Conductive vias (not shown) in the substrate 106 interconnect the front surface and back surface conductors. The conductors on the front and back surfaces of the substrate also serve as bond pads for receiving the balls 110, 120. The pitch of the balls 120 might be more or less than or equal to the pitch of the solder balls 110.

The balls 110, 114, 120 comprise suitable conductive materials, such as solder for balls 110 and solder, gold, copper, or a combination thereof for balls 114 and 120.

Over the dies 102, interposer 104, and the top surface of the substrate 106 is an overmold 108 of an encapsulant such as epoxy or the like. The overmold serves to protect everything within it from environmental hazards, such as moisture and dirt, and to provide mechanical rigidity to the package 100. In an alternative embodiment, the overmold is not used. In another alternative embodiment, spaces between the solder balls 114 or between the solder balls 120 can be underfilled with an epoxy-based liquid that is then hardened.

The interposer 104 comprises a first flexible tape 130, an intermediate layer 132, and an optional, second flexible tape 134. Each flexible tape is formed from an organic polymer with one or more layers of conductors thereon to form a signal-routing structure. Structural details of the tapes 130, 134 and intermediate layer 132 are not shown in this figure due to the complexity and scale of the details in comparison to the size of the package 100. However, those details will be evident from the manufacturing processes described in connection with FIGS. 2, 4, and as shown in FIGS. 3A, 3B, and 5-10.

The intermediate layer 132 has a plurality of conductive pillars 136 therein, the pillars comprising a suitable conductive material such as copper or solder. As will be evident from the process described in FIG. 2, the intermediate layer 132 is formed from an organic polymer material, such as epoxy, that adheres well to the flexible tape 130, can be easily ground down, and is sufficiently rigid for the interposer to be thermosonically attached to the dies 102 and to the substrate 106 using conductive balls 114, 120, respectively.

Figure 3A:
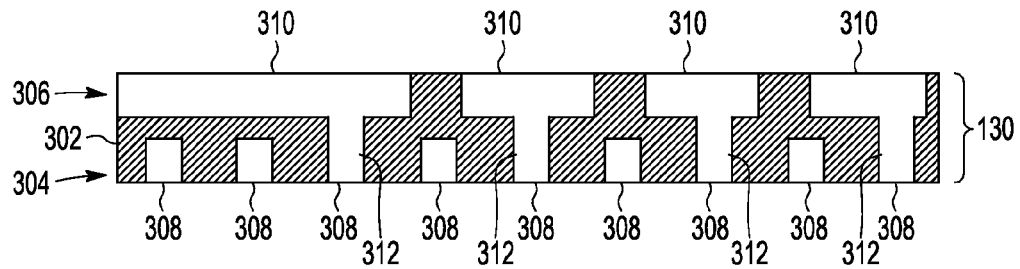
FIGS. 3A and 3B are enlarged cross-sectional side views of two flexible tapes made in accordance with the process of FIG. 2.
Figure 3B:
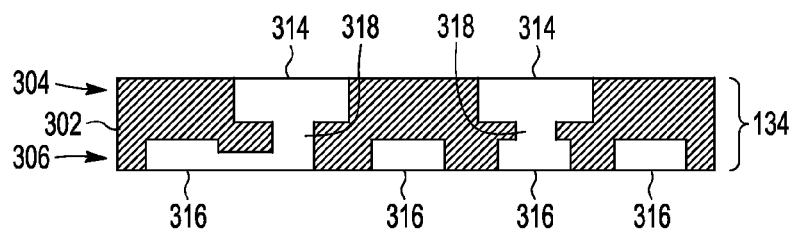
Figure 4:
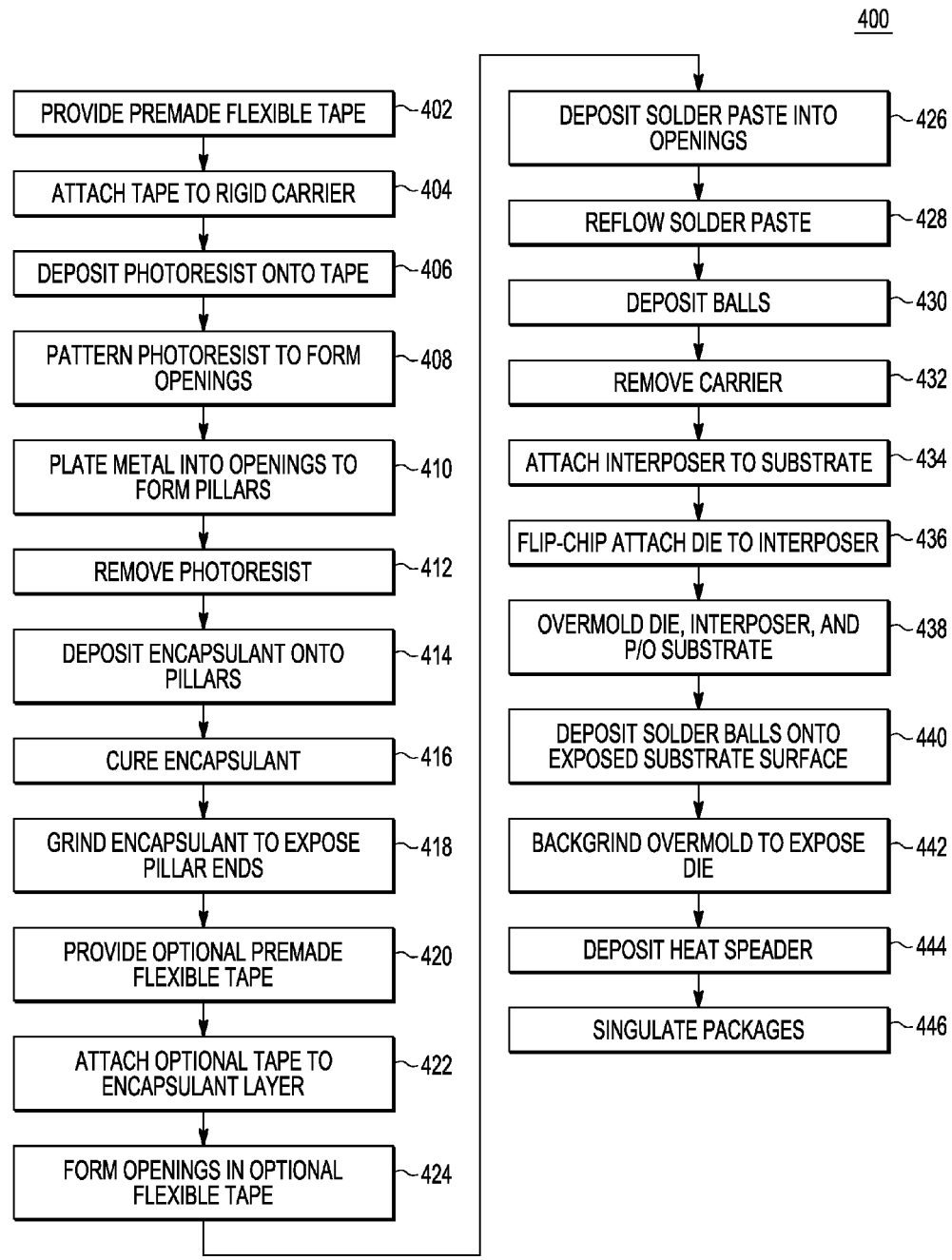
FIG. 4 is a flow chart showing an example of an assembly process used to assemble a BGA package consistent with certain embodiments of the invention, such as the BGA package of FIG. 1.

As will be evident from FIGS. 3, 4, and the associated description herein, the flexible tapes 130, 134 each comprise at least one insulating layer of a flexible insulating material, such as polyimide, polybenzoxazole (PBO), or another suitable insulating material. On opposing sides of the insulating layer are patterned metal traces (not shown) that are interconnected from one side of the insulating layer to the other side by conductive vias (not shown) in the insulating layer. The traces and the vias provide signal routing by each of the flexible tapes 130, 134. In other embodiments, each flexible tape 130, 134 might comprise two or more insulating layers with metal traces disposed between the insulating layers as well as on the top and bottom sides of the flexible tape.

The conductive pillars 136 in the intermediate layer 132 interconnect the first flexible tape 130 with the optional flexible tape 134, or directly to the metal balls 120 when tape 134 is not present. As will be described in more detail below, the tape 134 is attached to the intermediate layer 132 by a layer of adhesive (not shown), and the conductive traces on the tape 134 are electrically connected to the pillars 136 by volumes of solder (referred to herein as solder plugs) that fill vias (not shown) in the tape and the adhesive layer. The solder adheres to (wets) ends of the pillars 136 and sides of the metal traces exposed by the vias.

In accordance with certain embodiments of the invention, the balls 114 are closer together (smaller pitch) than the balls 120 or 110. The balls 114 are attached to bond pads (not shown) formed from conductive traces on one side (surface 116) of the tape 130. The balls 120 are attached directly to the conductive pillars 136 if tape 134 is not present. If tape 134 is present, then balls 120 are attached to bond pads formed from conductive traces on an exposed side (surface 118) of the tape 134.

Because of its surface roughness, a substrate of glass-epoxy laminate is generally incapable of supporting very finely pitched conductors, e.g., pitches smaller than approximately 50 microns. As such, an interposer might be formed using material with a smoother surface than is possible with glass-epoxy. Typical known interposer materials are glass and silicon. These materials have (i) the advantage of supporting very finely pitched conductors thereon and (ii) a coefficient of expansion that is substantially equal to that of the corresponding dies.

However, such materials are relatively expensive to process, making the overall package expensive. Moreover, there is still a significant difference in coefficient of thermal expansion between that of a silicon or glass interposer and that of a glass-epoxy substrate (approximately 1:9, respectively) so that the reliability of the balls interconnecting the interposer to the substrate during thermal cycling might be an issue. Thus, it is desirable to provide an interposer that serves as a buffer to absorb stresses caused by the difference between the coefficient of thermal expansion of the substrate and that of the dies, and is less expensive to make than previous interposer designs.

In accordance with certain embodiments of the invention, the flexible tape 130 in the interposer 104 might absorb the above-mentioned stresses, and the conductors thereon can match the spacing of the die pads on the dies 102. Further, the intermediate layer 132 is a low-cost rigid piece that adheres well to the flexible tape and might have a lower production cost than traditional glass-based or silicon-based interposer designs.

Figure 2:
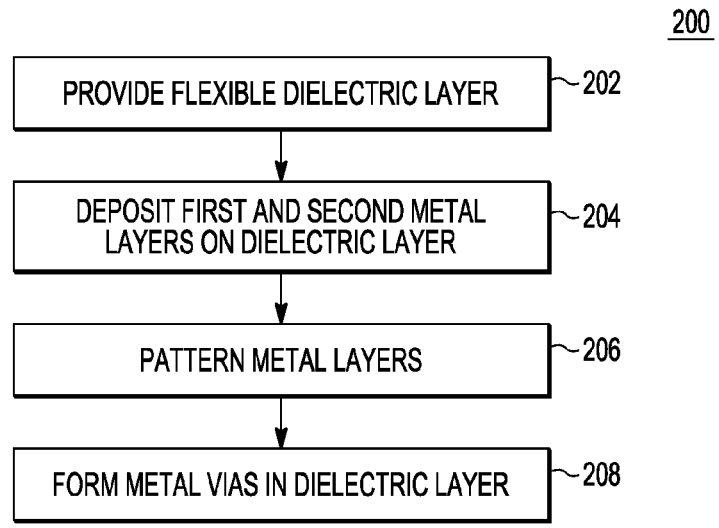
FIG. 2 is a flow chart showing an example of an assembly process used to manufacture a flexible tape used in certain embodiments of the invention, such as the BGA package of FIG. 1.

In FIG. 2, a process 200 is shown that might be used to create the multilayer flexible tapes 130 and 134 (FIG. 1). Beginning with step 202, a flexible dielectric layer of a flexible polymer, such as polyimide, PBO, or the like, is provided, and first and second metal layers are deposited on respective first and second major surfaces of the dielectric layer in step 204. The metal layers are typically formed from copper or a copper alloy. The metal layers are then patterned e.g., photolithographically, in step 206 to form metal traces on the surfaces, including first and second sets of bond pads on the respective first and second surfaces. Next, in step 208, metal vias are formed in the dielectric layer to interconnect the metal traces.

It is understood that, in another embodiment consistent with the invention, additional sets of alternating of dielectric and patterned metal layers might be disposed between the first and second surfaces by repeating some of the above-described steps or adding additional steps known to those skilled in the art. The resulting structure might be similar to those shown in FIGS. 3A and 3B where the flexible tapes 130, 134 each have a flexible organic polymer layer 302 between conductive traces in trace layers 304, 306.

For tape 130 shown in FIG. 3A, traces in trace layer 304 form bond pads 308 for receiving balls 114 (FIG. 1). Some of the traces in trace layer 306 in tape 130 form bond pads 310 that will be connected to the pillars 136 (FIG. 1). Because the pitch of the die pads (not shown) on the die 102 (FIG. 1) is generally much less than that of the pillars 136, some of the traces in trace layer 306 might be used instead for signal routing. Further, a few of the bond pads 308 connect to traces in trace layer 304 by vias 312.

For tape 134 shown in FIG. 3B, traces in trace layer 304 form bond pads 314 for receiving balls 120 (FIG. 1), while traces in trace layer 306 form pads 316 that will be electrically connected to exposed ends of the pillars 136 (FIG. 1). For simplicity, the traces are shown within the flexible layer 302. However, it is understood that the traces might be on the surface of the layer 302 or partially embedded therein. Although the figures are not to scale, it is understood that the pitch of the bond pads 310 and 316 are substantially the same or greater than the pitch of bond pads 308. The pitch of bond pads 314 are typically, but not necessarily, the same as or greater than that of bond pads 316.

FIG. 4 is a flowchart showing an example of a manufacturing process 400 that may be used to assemble a BGA package consistent with various embodiments of the present invention, such as package 100, although it should be appreciated that there are many other variations of manufacturing processes.

As shown in FIG. 4, the assembly process begins at step 402, where a premade flexible tape is provided. In one embodiment, the flexible tape is premade in accordance with the process 200 in FIG. 2 and as described above, although it should be appreciated that there are many other variations of manufacturing flexible tape.

Figure 5:
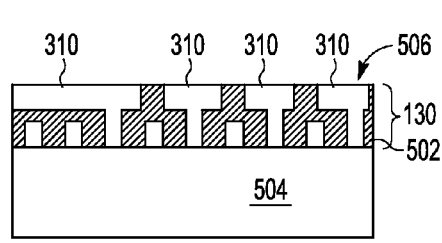
FIGS. 5-10 are enlarged cross-sectional side views of the BGA package of FIG. 1 at various intermediate steps in the process of FIG. 2.

In step 404, the flexible tape is attached by an adhesive layer to a (reusable) rigid, flat carrier, made of metal, ceramic, or other suitable material. The adhesive layer might be a double-sided tape or the like. The adhesive layer is preferably a type of adhesive that "releases" or loses its adhesive quality when heated above a known temperature. The resulting structure is shown in FIG. 5. Here the first surface 502 of the multilayer flexible tape 130, made in accordance with the steps described above, is shown attached to a carrier 504, leaving the second surface 506 and bond pads 310 exposed.

Figure 6:
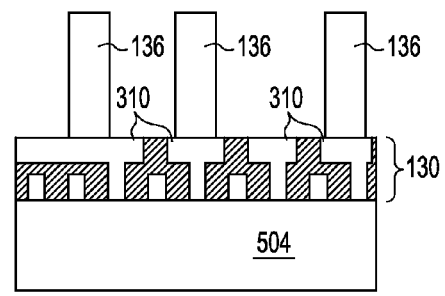

Returning to FIG. 4, in step 406, a layer of photoresist is deposited onto the second (exposed) surface of the tape 130, and then the photoresist is patterned in step 408 to form openings that expose the bond pads thereon. In one embodiment of the invention, metal, such as copper or solder, is plated into the openings in step 410 to form pillars 136 (FIG. 1), and the photoresist is then removed in step 412 by, for example, chemically stripping the resist from the tape. The resulting structure is shown in FIG. 6. Alternatively, instead of plating copper or solder into the openings, the pillars are formed by dropping solder balls into the openings and then reflowing the solder to wet the exposed bond pads 310 to form the pillars 136.

In an alternative embodiment, steps 406-412 are not performed, and the pillars 136 are formed by using a conventional thermosonic ball-bond wire bonder to create wire bond bumps but with the bond wire cut off at the bump, leaving a vertical projection. The wire might comprise copper, a copper alloy, or gold or other alloys.

Figure 7:
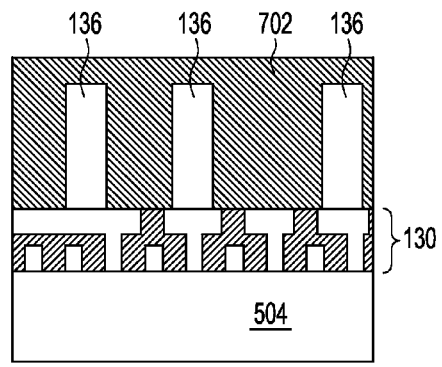

In step 414, an organic polymeric compound is deposited on the tape 130 and pillars 136 by, for example, applying the polymeric compound using a mold insert of a conventional injection-molding process, as is known in the art. The polymeric material is typically applied as a liquid polymer, such as an epoxy, which is then cured in step 416 by heating or exposure to UV light to form a solid that adheres to the tape 130. The polymeric material can also be a solid that is heated to form a liquid for application and then cooled to form a solid mold. Subsequently, an oven might be used to cure the polymeric material to complete cross-linking of the polymer. In alternative embodiments, other encapsulating processes may be used. The result of this step is shown in FIG. 7 where polymeric material 702 is shown filling between and over the pillars 136.

Figure 8:
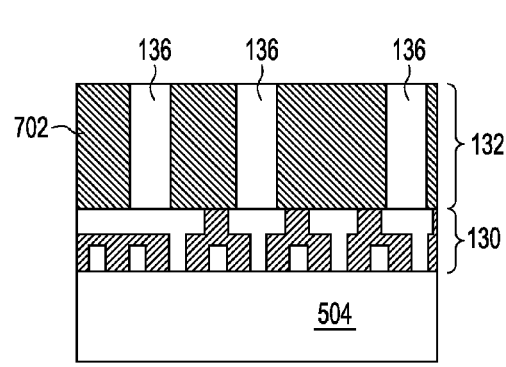

In step 418, the polymeric material 702 is ground down to expose the pillars 136, leaving the ground surface of the polymeric material substantially planar with the exposed ends of the pillars to form intermediate layer 132. The resulting structure is shown in FIG. 8. Here, the intermediate layer 132 is shown attached to the tape 130 with the ends of the pillars 136 exposed.

Next, in steps 420-428, the optional flexible tape 134 is attached to the intermediate layer 132.

Beginning with step 420, the optional flexible tape 134 is provided and might be made using the same steps described above regarding the exemplary process 200 (FIG. 2) used to make the tape 130 and as shown in FIG. 3B. In step 422, the tape 134 is attached to the exposed surface of the intermediate layer 132 (the surface having the exposed ends of the pillars 136) using an adhesive layer that is applied to either the tape 134 or to the exposed surface of the intermediate layer 132.

To make an electrical connection between bond pads 316 on the tape 134 (FIG. 3B) and the pillars 136, in step 424, openings are formed in the tape and the adhesive layer below using, for example, a conventional X-Y position-controlled laser drill, to expose the ends of the pillars 136 and portions of the bond pads 316 (FIG. 3B) on the tape 134 to which the pillars are to be connected.

Then, in step 426, a solder paste is deposited into the openings formed in step 424 using, for example, a conventional screen-printing technique. In step 428, the structure is subjected to heat to reflow the solder paste, wetting the ends of the pillars 136 and the exposed portions of the bond pads 316, thereby electrically interconnecting the pillars to the traces in the tape 134.

Figure 9:
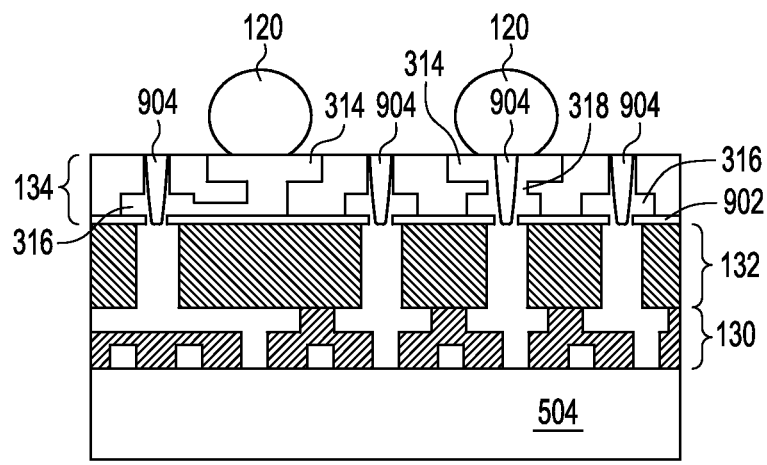
Figure 10:
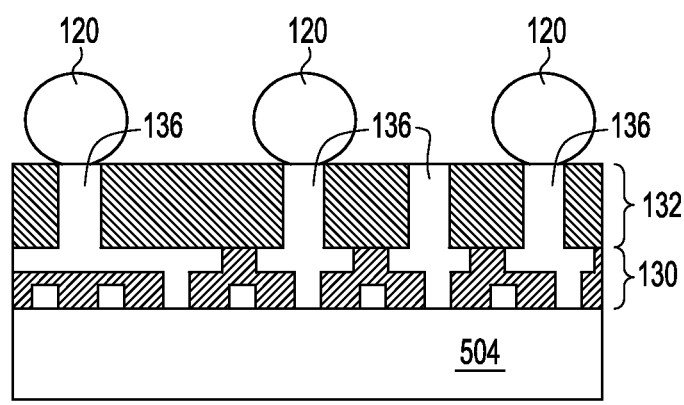

In step 430, the metal balls 120 (FIG. 1) are formed on ball bond pads 314 on the exposed surface of the tape 134, completing the interposer 104. These balls may be deposited using conventional screen-printing, plating, or ball-drop techniques. The resulting structure (after reflow of the solder plugs 904) is shown in FIG. 9 where an adhesive layer 902 binds the optional tape 134 to the intermediate layer 132. As shown, the balls 120 are placed on the bond pads 314 and might be on or adjacent to the solder plugs 904. In several instances shown in FIG. 9, certain solder plugs 904 each connect one of the pillars 136 to a bond pad 316 in the tape 134. In one instance, however, a solder plug 904 passes through a via 318 that directly connects one of the bond pads 314 to one of the bond pads 316.

If the tape 134 is not used, then steps 420-428 are skipped and instead, in step 430, the solder balls 120 are formed on the exposed ends of the pillars 136 using conventional screen-printing, plating, or ball-drop techniques, thereby completing the interposer 104. The resulting structure will be similar to that shown in FIG. 10. For simplicity, not all solder balls 120 are shown on the ends of the pillars 136.

After the balls 120 are attached in step 430, in step 432, the carrier 504 attached in step 404 is, for example, heated to release the adhesive holding it to the tape 130. The completed interposer 104 is then attached to the substrate 106 in step 434 by a combination of heat and mechanical (typically sonic) vibration to melt the solder balls 120, thereby wetting bond pads on the substrate 106 and completing the ball bonding of the interposer 104 to the substrate.

Next, in step 436, the dies 102 (FIG. 1), already having the balls 114 attached to the bond pads thereof, are placed with the balls 114 in contact with ball bond pads 308 (FIG. 4) on the first surface 116 of the tape 130. The dies 102 are attached to the tape 130 using conventional flip-chip or controlled-collapse chip connection techniques so that each ball 114 is attached to a corresponding bond pad 308. A conventional "pick and place" tool might be used to place the dies on the tape 130.

After the dies 102 and substrate 106 are attached to the interposer 104, in step 438, the epoxy overmold 108 is deposited by, for example, applying a molding compound using a mold insert of a conventional injection-molding process, as is known in the art. The molding material is typically applied as a liquid polymer, which is then cured by heating and/or exposure to UV light to form a solid. The molding material can also be a solid that is heated to form a liquid for application and then cooled to form a solid mold. Subsequently, an oven might be used to cure the molding material to complete the cross linking of the polymer. In alternative embodiments, other encapsulating processes may be used.

In step 440, solder balls 110 (FIG. 1) are deposited on bond pads (not shown) on the substrate 106 by any one of a variety of known techniques, such as ball drop, screen-printing, or plating.

If a heat spreader is to be attached to the package 100, then, in step 442, the overmold 108 is ground down, using well-known techniques such as backgrinding, to expose the backside of the dies 102. Then, in step 444, a heat spreader, such as copper or a copper alloy, aluminum, or other suitable heat-conducting material, is deposited on the package 100 and in contact with the exposed backsides of the dies 102. If no heat spreader is to be added, then steps 442 and 444 are skipped.

In either case, in step 446, the packages 100 are singulated into individual packages using a saw or laser to create individual instantiations of BGA package 100.

At this point, the singulated BGA package 100 can be attached to a printed wiring board or other device (not shown) using a process such as thermo-compression bonding of the balls 110 disposed on the bottom surface of package 100 to the printed wiring board.

The present invention takes advantage of one or two flexible tapes and an epoxy-based intermediate layer to form a low-cost interposer for a BGA semiconductor package or the like. As such, the flexible tapes, sandwiching the rigid intermediate layer, can absorb stress caused by different thermal coefficients of expansion of the constituent parts of the BGA package during thermal cycling. As a result, a BGA package of the present invention might be less expensive and more reliable than an analogous conventional BGA package.

Although embodiments of the invention are described herein as including multiple IC dies disposed within a BGA package, in alternative embodiments, a single semiconductor die is disposed within a single package.

By now, it should be appreciated that there has been provided an improved BGA package and a method of forming the improved BGA package. Circuit details are not disclosed because knowledge thereof is not required for a complete understanding of the invention.

Although the invention has been described using relative terms such as "front", "back", "top", "bottom", "over", "above", "under", and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles.

As used herein, the term "mount", as in "a component mounted on a substrate" or a step of "mounting a component on a substrate", covers situations in which the component is mounted directly onto the substrate with no other intervening components or structures, as well as situations in which the active component is directly mounted to one or more other components and/or structures, which are, in turn, directly mounted to the substrate.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation".

The invention claimed is:

1. A method for assembling an integrated circuit package, the method comprising:
    a) providing a flexible tape having first and second sets of bond pads on respective first and second surfaces thereof;
    b) attaching the first surface of the flexible tape to a carrier;
    c) forming conductive pillars on the second set of bond pads;
    d) depositing an intermediate layer of polymeric compound on the second surface of the flexible tape;
    e) grinding a surface of the intermediate layer to expose ends of the conductive pillars to form a sub-assembly comprising the flexible tape and the intermediate layer;
    f) removing the carrier from the sub-assembly, thereby creating an interposer;
    g) attaching the interposer to a substrate;
    h) attaching at least one die to the interposer,
    wherein, after step e) and before step f), the method further comprises:
        attaching an additional flexible tape to the intermediate layer using an adhesive layer;
        forming openings in the additional flexible tape and the adhesive layer, thereby uncovering the exposed ends of the conductive pillars;
        depositing solder into the openings; and
        reflowing the solder to form solder plugs that connect the conductive pillars to conductive traces on the additional flexible tape,
        whereby the interposer includes the attached additional flexible tape; and
    overmolding the at least one die, the interposer, and a portion of the substrate with a molding compound, thereby leaving a surface of the substrate exposed.

2. The method of claim 1 wherein the flexible tape has one or more conductive traces and one or more vias configured to interconnecting the first and second sets of bond pads.

3. The method of claim 1 wherein the second set of bond pads has a pitch greater than that of the first set of bond pads.

4. The method of claim 1, wherein step c) comprises:
    c1) depositing photoresist on the second surface of the flexible tape;
    c2) patterning the photoresist to form openings in the photoresist that exposes the second set of bond pads;
    c3) depositing metal into the openings to form the conductive pillars; and
    c4) removing the patterned photoresist.

5. The method of claim 4 wherein, in step c3), the metal is deposited by plating copper or solder into the openings.

6. The method of claim 1 wherein, in step c), the metal is deposited by forming wire bond stud bumps or by placing solder balls onto the second set of bond pads.

7. The method of claim 1, wherein a laser is used to form the openings in the additional flexible tape and the adhesive layer.

8. The method of claim 7, wherein the additional flexible tape has bond pads on a surface thereof and the substrate has bond pads on a surface thereof, the method further comprising:
    forming metal balls on the additional flexible tape bond pads or the substrate bond pads; and
    ball-bonding the substrate bond pads to the additional flexible tape bond pads;
    wherein the additional flexible tape bond pads are aligned with the substrate bond pads.

9. The method of claim 1, wherein step h) comprises:
    forming metal balls on die bond pads on the at least one die; and
    flip-chip bonding the at least one die to the interposer,
    wherein the die bond pads are aligned with the first set of bond pads on the flexible tape.

10. The method of claim 1, wherein the substrate has bond pads on first and second surfaces thereof, the method further comprising:
    forming metal balls on the bond pads on the first surface of the substrate or the exposed ends of the conductive pillars;
    ball-bonding the exposed ends of the conductive pillars to corresponding bond pads on the first surface of the substrate;
    wherein the bond pads on the first surface of the substrate are aligned with the exposed ends of the conductive pillars.

11. The method of claim 10, further comprising:
    attaching solder balls to the bond pads on the second surface of the substrate;
    wherein the bond pads on the second surface of the substrate are arranged in rows and columns along a periphery of the substrate.

12. The method of claim 1, wherein the molding compound and the polymeric compound comprise epoxy.

13. The method of claim 1, further comprising:
    backgrinding the overmold to expose a backside of the at least one die; and
    attaching a heat spreader to the exposed backside of the at least one die.

14. The method of claim 1, wherein step a) comprises:
    a1) providing a flexible dielectric layer;
    a2) depositing a first conductive layer on the dielectric layer to form the first surface of the flexible tape;
    a3) depositing a second conductive layer on the dielectric layer opposite the first conductive layer to form the second surface of the flexible tape;

a4) patterning the first conductive layer to form first conductive traces and the first set of bond pads;
a5) patterning the second conductive layer to form second conductive traces and the second set of bond pads; and
a6) forming conductive vias in the dielectric layer, the conductive vias configured to electrically interconnect the first and second conductive traces.

\* \* \* \* \*